United States Patent [19]

Shay

[11] Patent Number: 5,508,649
[45] Date of Patent: Apr. 16, 1996

[54] VOLTAGE LEVEL TRIGGERED ESD PROTECTION CIRCUIT

[75] Inventor: Michael J. Shay, Arlington, Tex.

[73] Assignee: National Semiconductor Corporation, Santa Clara, Calif.

[21] Appl. No.: 278,301

[22] Filed: Jul. 21, 1994

[51] Int. Cl.⁶ .................................................. H02H 9/04
[52] U.S. Cl. ........................... 327/318; 327/78; 327/143; 361/56
[58] Field of Search ............................ 327/78, 143, 134, 327/77, 72, 318, 319, 320, 321, 310; 361/56, 111

[56] References Cited

U.S. PATENT DOCUMENTS

| | | | |
|---|---|---|---|
| 4,107,556 | 8/1978 | Stewart et al. | 307/362 |
| 4,254,347 | 3/1981 | Ray | 307/297 |
| 4,558,233 | 12/1985 | Nakamori | 307/362 |
| 4,633,107 | 12/1986 | Norsworthy | 307/594 |
| 4,888,497 | 12/1989 | Dallabora et al. | 307/272.3 |
| 4,922,133 | 5/1990 | Iwahashi et al. | 327/77 |
| 4,970,408 | 11/1990 | Hanke | 307/272.3 |
| 5,051,611 | 9/1991 | Kantz | 307/272.3 |
| 5,111,067 | 5/1992 | Wong et al. | 307/272.3 |
| 5,136,181 | 8/1992 | Yukawa | 307/296.1 |
| 5,159,206 | 10/1992 | Tsay et al. | 307/272.3 |
| 5,180,926 | 1/1993 | Skripek | 327/143 |
| 5,200,648 | 4/1993 | Vyas | 327/291 |
| 5,237,395 | 8/1993 | Lee | 361/56 |
| 5,239,440 | 8/1993 | Merrill | 361/56 |
| 5,255,146 | 10/1993 | Miller | 361/56 |
| 5,311,391 | 5/1994 | Dungan et al. | 361/56 |
| 5,323,067 | 6/1994 | Shay | 307/272.3 |
| 5,349,559 | 9/1994 | Park et al. | 327/541 |

FOREIGN PATENT DOCUMENTS

| | | | |
|---|---|---|---|
| 55-47727 | 4/1980 | Japan | 307/272.3 |
| 55-77233 | 6/1980 | Japan | 307/296.5 |

OTHER PUBLICATIONS

United States SIR, Piasecki, Registration No. H497, Published Jul. 5, 1988.

*Primary Examiner*—Terry Cunningham
*Assistant Examiner*—Terry L. Englund
*Attorney, Agent, or Firm*—Skjerven, Morrill, MacPherson, Franklin & Friel; Norman R. Klivans

[57] ABSTRACT

A voltage level triggered ESD protection circuit is immune to standard signal transitions up to approximately 5.5 volts, does not consume any DC current either in the powered up or powered down states, and is interfaceable to a live bus when the system it is connected to is powered down. The trigger circuit is reliably immune to tripping from applied fast bus transitions on a powered-down integrated circuit. The trigger signal is generated in response to sensing both a voltage transition and to reaching a voltage set point such as 7 volts, rather than merely triggering off the voltage transition.

17 Claims, 6 Drawing Sheets

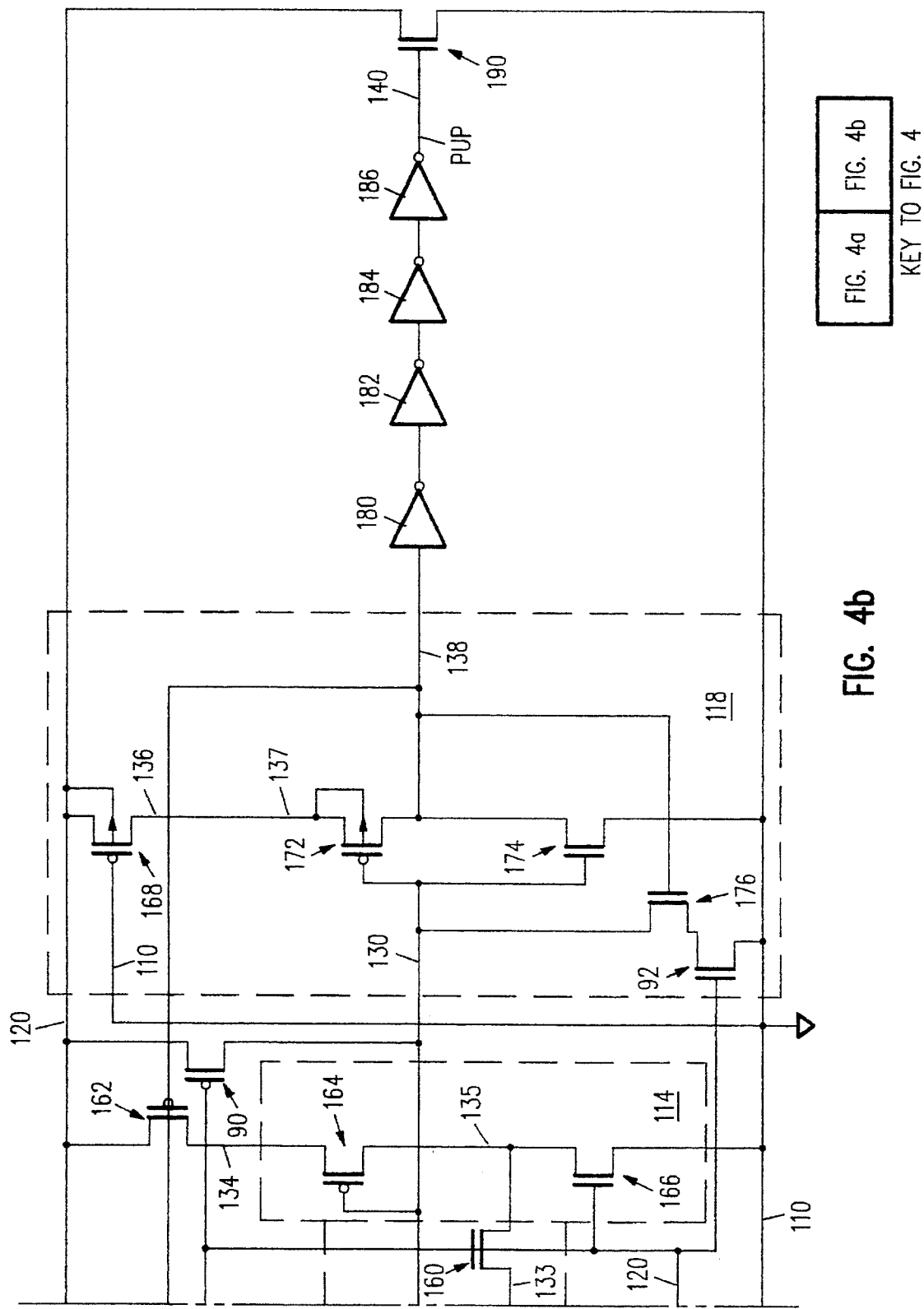

VOLTAGE LEVEL TRIGGERED ESD PROTECTION CIRCUIT

BACKGROUND OF THE INVENTION

1. Field of the Invention

This invention relates to integrated circuits, and more specifically to protecting an integrated circuit against electrostatic discharge while conserving power when the integrated circuit is connected in a system.

2. Description of the Prior Art

FIG. 1a illustrates an ESD portion of a typical integrated circuit, showing only the power conductors and a portion of the input/output section of the integrated circuit. Illustrated are several conventional input and/or output pads 10a, 10b which are only two of many such pads on a typical integrated circuit, for electrical connection to circuitry exterior to the circuit. Pads 10a, 10b are connected respectively to conventional input/output (I/O) logic circuitry 12a, 12b which respectively connects lines 14, 16 to the remaining portions of the integrated circuit (not illustrated here for simplicity). The power supply line 20 (the "upper rail") connects to voltage source $V_{DD}$. Diode isolation line 32 (the "floating ESD rail") and upper ESD isolation diode 34 isolate the upper rail line 20 from the effect of transient signals on pads 10a, 10b detected by the trigger circuit. The "lower rail" line 22 connects to ground.

Diodes 24a, 24b, 18a, 18b provide ESD (electrostatic discharge) protection for respectively I/O logic 12a, 12b. N-channel shunt transistor 50 connects line 32 to the lower rail 22 for ESD protection. This protection, as is well known, operates as follows. ESD protection is provided when the integrated circuit (I.C.) is not connected in a system, i.e. typically after manufacturing of the I.C. and before installation of the I.C. in a system. It is well known that integrated circuits not yet installed in a system are subject to damage by ESD due to careless handling. A typical ESD event involves a fast rising static electric discharge which may rise from 0 volts to 2,000 volts and higher. So in this case, prior to installation in a system, both the upper rail 20 and the lower rail 22 are floating in terms of their voltage level.

The object is to drain the ESD to ground so that a minimum amount thereof flows into the I/O logic 12a, 12b, and hence only this minimal amount of charge passes to the remaining portions of the integrated circuit via lines 14 and 16. This is accomplished by a trigger circuit 42 (described in detail below) which provides an output signal to the gate terminal of the N-channel shunt transistor 50. Upon detection by the trigger circuit 42 of such an ESD event on line 32, a signal is provided by trigger circuit 42 which turns on transistor 50, hence shunting electrostatic charge from line 32 to ground line 22. The current path for such an ESD event at pad 10a is via line 32 to shunt transistor 50 to ground rail 22 to pad 10b. Thus the ESD is shunted through ground to pad 10b which protects the delicate circuitry of the integrated circuit. During this time the ESD protection diodes 18a, 18b, 24a, 24b are forward biased, so that only insignificant levels of the ESD current which is present at pads 10a, 10b takes any path other than through shunt transistor 50. That is, shunt transistor 50 provides considerably less impedance than the gates of the I/O circuitry. This charge is dissipated quickly enough (given a low shunt impedance) to protect the I.C.

The circuit of FIG. 1a has been found to work quite well for a typical ESD event encountered when the I.C. is a not connected in a system, i.e. pads 10a and 10b are not connected and hence are "floating". However, the trigger portion 42 of this circuit has been found deficient when the I.C. is installed in a system and hence pads 10a, 10b are connected to other integrated circuits or to other devices such as a bus connecting to another apparatus. This is because the trigger portion may trip on a rising transient at standard operating voltages, e.g. 5 V.

In this case, the problem arises when the I.C. illustrated in FIG. 1a is powered down so that lines 20 and 22 are both at a common ground potential and AC signals are applied to pads 10a and 10b from connected circuits (not shown) that transition above ground. Typically the trigger circuit 42 will be activated by these fast rising transitions which are erroneously detected as being ESD events. Since these in fact are standard operating voltage transitions e.g. 3.3 V, 5 V . . . , they pose no danger of damaging the integrated circuit. This problematically turns on the I.C. of FIG. 1a, causing current to flow at least momentarily during the duration of the trigger signal from line 32 to line 22 through shunt transistor 50. This shunting draws a large amount of current, for a period of time usually 1 μs or longer, undesirably wasting power. This is primarily a problem with battery operated systems where power conservation is important.

The prior art trigger circuit 42 is shown in FIG. 2 where resistor 52 is connected to capacitor 54, with the node 58 between resistor 52 and capacitor 54 connected to inverter 56, the output terminal of which is connected to the gate of shunt transistor 50. The upper terminal of shunt transistor 50 is connected to line 32 (of the circuit of FIG. 1a).

This FIG. 2 circuit operates as a standard RC delay shunt enable circuit. After a sharp rising transient occurs on line 32 rising from the reference voltage to an applied voltage upper bias point, the node 58 will gradually rise towards the applied voltage. Immediately after the sharp rising transient, the node 58 voltage is below the inverter 56 low-transitioning trip point. Thus, the inverter is driving high (the applied voltage) to the gate of N-channel shunt transistor 50. The shunt transistor is now on and is shunting the applied voltage down to the reference node. This will cause a decay in the applied voltage (in the case of an ESD event). Eventually, a combination of the decay in the applied voltage and the changing potential of node 58 will cause node 58 to be above the low-transitioning trip point of inverter 56. This will force the output of inverter 56 low, to the reference voltage, and thus turn off the shunt transistor 50.

When the circuit in FIG. 2 is used as the trigger in FIG. 1a, its major disadvantage is that it can not be effectively used for ESD protection of powered down ICs interfacing with an active bus. The active bus may cause the trigger circuit to turn on the shunt, thus wasting power and potentially causing functional problems on the bus.

An alternate prior art solution (see FIG. 1b) to this problem is use of a Zener diode 59 for ESD protection connected between pad 10C and I/O logic 12C and to ground 22, with I/O output being on line 17, as an alternative to the circuit in FIG. 1a. However, use of Zener diodes is not compatible with many IC CMOS fabrication processes using lightly doped drains, due to current leakage or complete reverse breakdown at or below the standard operating voltage.

Thus there is a need for a trigger circuit which is reliably immune to tripping for fast bus transitions applied to a powered-down I.C. connected to the bus. The trigger circuit desirably would sense voltage but not consume DC current, either in the I.C. powered-up or powered-down modes and would be compatible with conventional CMOS IC fabrication processes.

SUMMARY OF THE INVENTION

In accordance with the invention, a trigger circuit for ESD protection that controls a shunt transistor trips off a voltage set point (voltage level) in addition to a voltage transition dV/dt, such as in the above-described prior art RC trigger circuit. In accordance with the invention, a dV/dt ramp is detected as in the prior art, and combined with comparison of the level of this voltage ramp to a voltage reference level so that the triggering (turning on the powered-down I.C.) only occurs when the ramp voltage exceeds a particular level. This eliminates the problem of turning on the shunt transistor when a fast rising standard transition having a voltage e.g. of 5 volts applied to the input/output pads of an I.C., and hence conserves power.

In accordance with the invention, the trigger circuit is enabled only during a transition when a dV/dt ramp occurs, so that the trigger circuit only senses the voltage level during the transition, otherwise not drawing power and hence conserving power. This is ideal for battery operated applications. The trigger circuit in accordance with the invention does turn on the shunt for a typical ESD event but does not turn on the shunt for a fast rising standard transition (i.e., a signal within a predetermined voltage range) from an active connected bus. This prevents the shunt from drawing power when the I.C. is powered up and a fast rising standard transition is received at the chip.

Also provided in accordance with the invention is an ESD protection circuit especially useful with the present trigger circuit, where the trigger circuit is connected in series between the I/O pad and ground, as are the associated shunt transistor and protective diode.

DETAILED DESCRIPTION OF THE INVENTION

Figure 2:
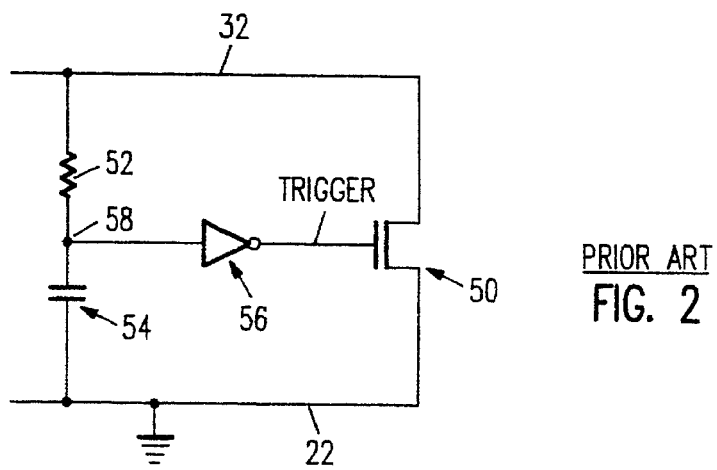
FIG. 2 shows a prior art ESD RC trigger circuit.
Figure 3:
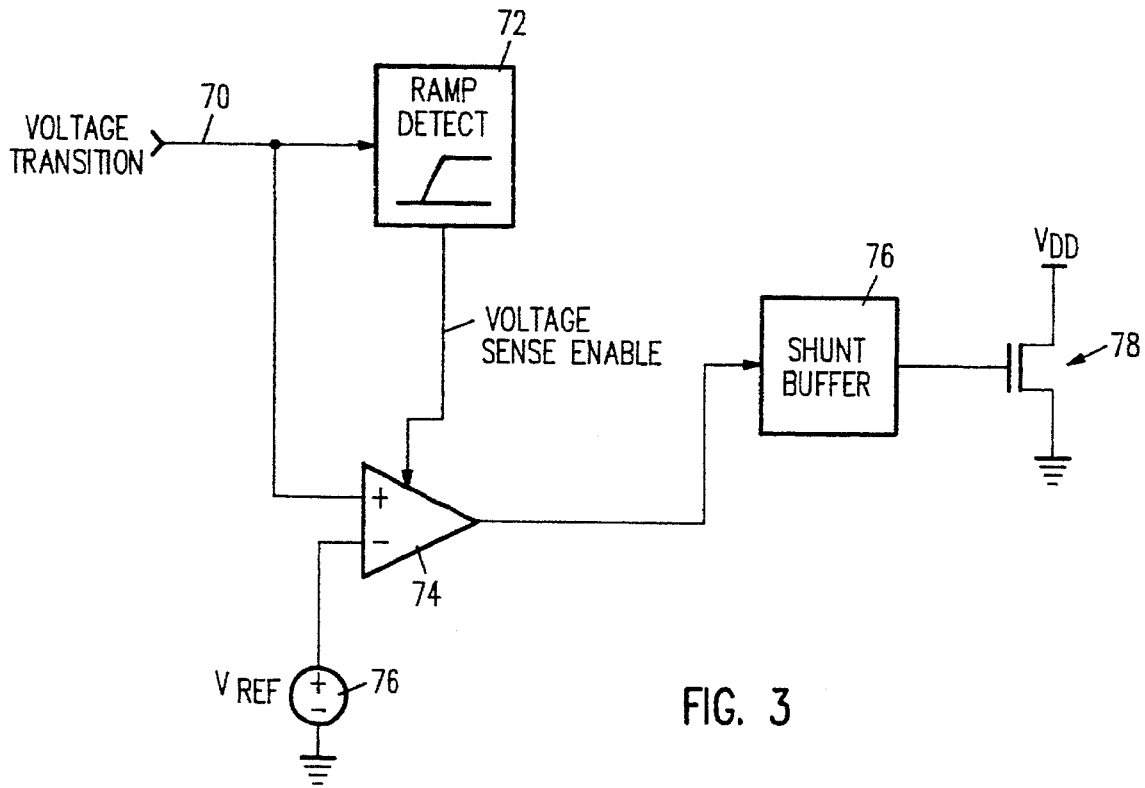
FIG. 3 shows in block diagram form an ESD trigger circuit in accordance with the present invention.

An ESD trigger circuit in accordance with the invention is shown in block form in FIG. 3. A voltage transition applied to node (I.C. pad) 70 (typically from an active bus as in FIG. 1a) is input to a ramp detection circuit 72. Circuit 72 may be for instance a prior art RC ramp detection circuit as in FIG. 2. Also connected to node 70 is a comparison circuit 74 which compares the voltage at node 70 to a reference voltage $V_{REF}$ from source 76.

The output signal from the ramp detection circuit 72 is applied as a voltage sense enable signal to voltage comparison circuit 74. The resulting output of comparison circuit 74 is applied to a shunt transistor buffering circuit 76 which provides an asserted (i.e. high) signal to the gate of shunt transistor 78 only if (1) the ramp is detected at 72 and also (2) the voltage of the ramp exceeds a particular level $V_{REF}$ as defined by voltage reference 76.

It is to be understood that FIG. 3 is not to be taken as a literal circuit, but as an explanation of the functioning of a variety of specific circuits in accordance with the invention.

Figure 1A:
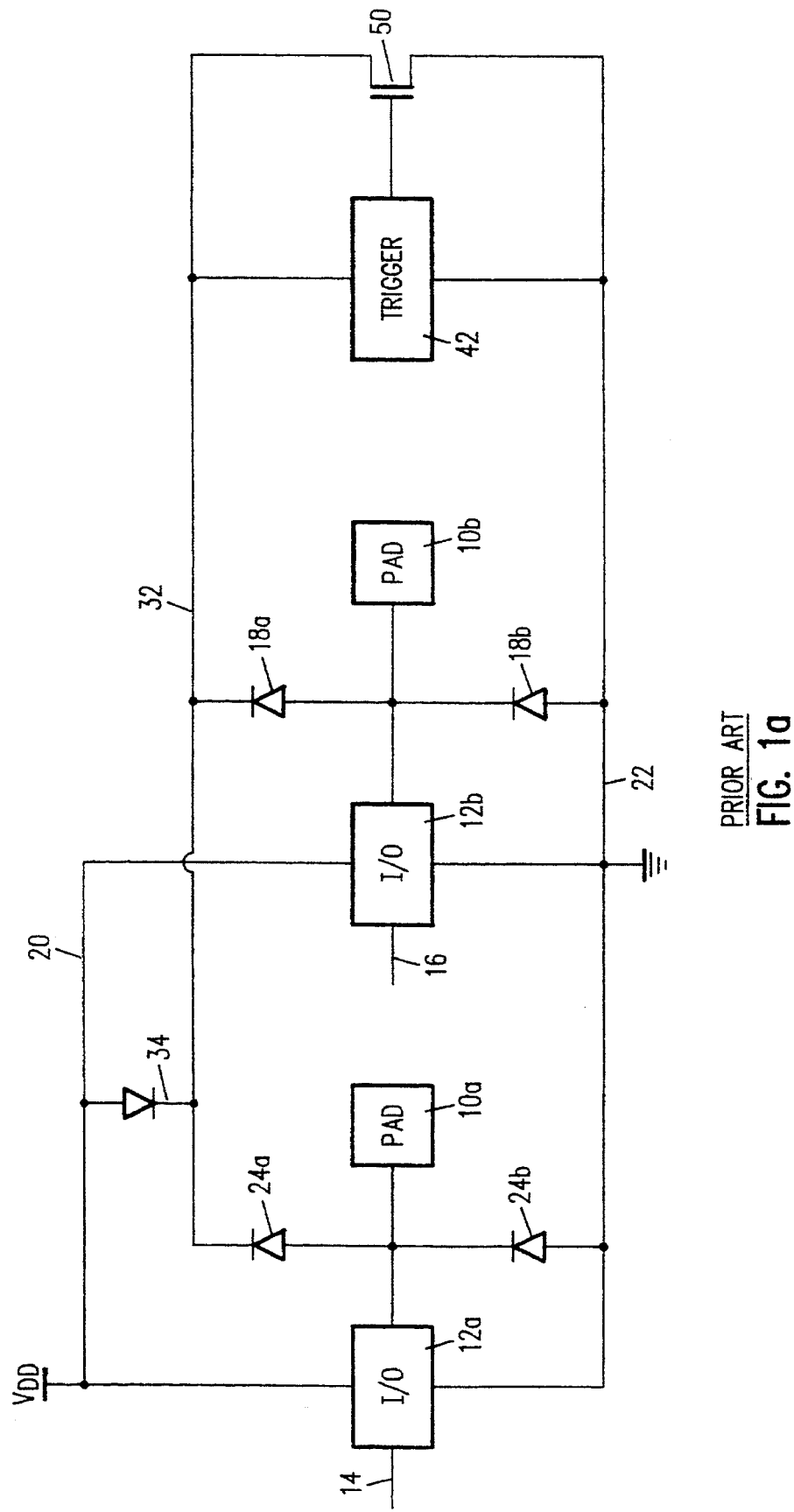
FIG. 1a shows an ESD protection circuit for integrated circuits, used in the prior art and also used in accordance with the present invention.
Figure 1B:
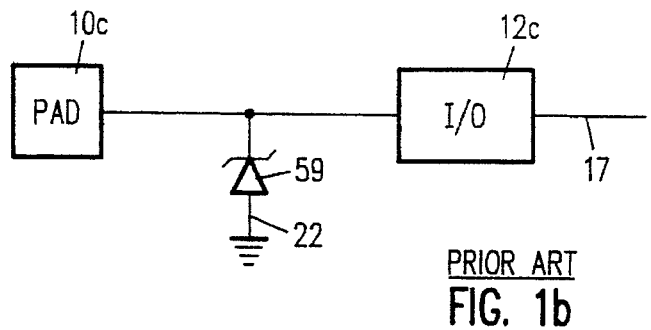
FIG. 1b shows a Zener diode-based ESD circuit.
Figure 4A:
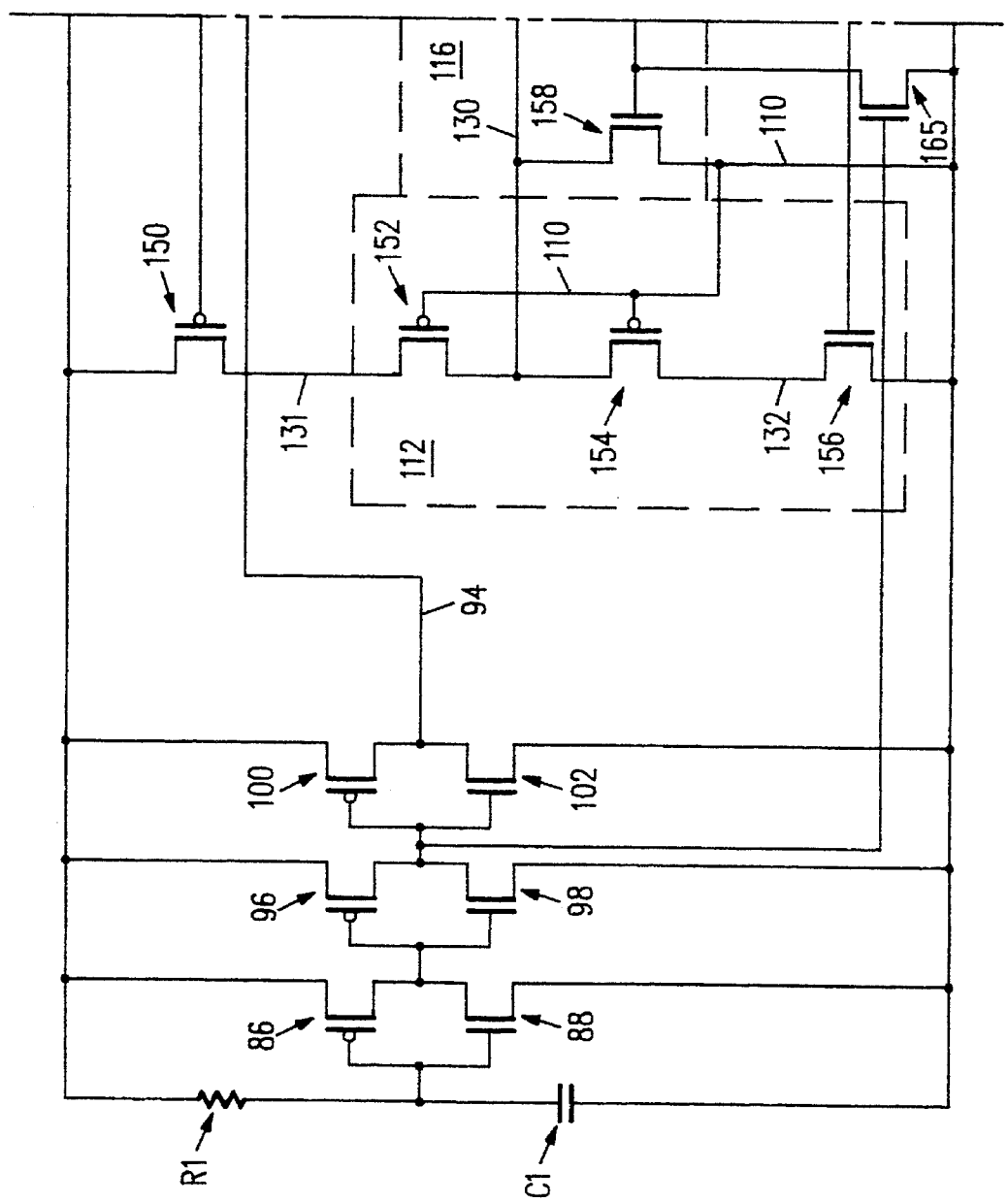
FIG. 4 shows a schematic of an ESD trigger circuit in accordance with the present invention.

One embodiment of a circuit in accordance with the present invention which includes the functions of the circuit of FIG. 3 is depicted schematically in FIG. 4. Portions of the circuit of FIG. 4 are similar to a circuit disclosed in and commonly owned U.S. patent application Ser. No. 08/048,542, now U.S. Pat. No. 5,323,067 issued Jun. 21, 1994 and invented by Michael J. Shay, filed Apr. 14, 1993. Only the trigger circuit and shunt transistor are shown in FIG. 4; the I/O pad(s), I/O logic, and ESD diodes as shown e.g. in FIG. 1a are omitted. This circuit is suitable for use in the ESD protection scheme of FIG. 1a or others.

It is to be understood that the upper rail (line 120 in FIG. 4) corresponds to line 32 in FIG. 1a, while reference terminal 110 is at a ground reference potential. Resistor R1 and capacitor C1 are similar to the corresponding elements of the RC ramp detector in the prior art of FIG. 2. A node between resistor R1 and capacitor C1 is connected to the gates of a first inverter pair of transistors, N-channel transistor 88 and P-channel transistor 86 which are a first input gain stage. Also provided are a second input gain stage of transistors 96, 98 and a third input gain stage of transistors 100, 102. The output terminal of the third input inverter pair 100, 102 is voltage sense enable terminal 94.

P-channel transistor 150 functions as a switching voltage source and, when conductive, controls a switch node 131 which follows the applied voltage on line 120. A divider circuit 112 is coupled between the switch node 131 and the reference terminal 110 and its output is a sensing node 130. The potential difference increases between node 130 and switching voltage source 120, during a rising transient and before the trip point of the circuit is reached. The divider circuit 112 includes a P-channel MOS transistor 152, which has its source coupled to switch node 131, its gate coupled to the reference terminal 110, and its drain coupled to the sensing node 130. (Since typical MOS transistors are bidirectional devices and conduct current equally well from drain to source as from source to drain, the distinction between the source and drain terminals is usually arbitrary.)

The source of a P-channel transistor 154 is likewise coupled to sensing node 130. The gate of transistor 154 is connected to the reference terminal 110 while its drain is coupled at node 132 to the drain of an N-channel MOS transistor 156, whose gate is connected to the voltage sense enable node 94 and whose source is connected to the reference terminal 110.

A P-channel switch transistor 162 couples a switch node 134 to the supply line 120 and similarly generates, when conductive, a voltage at switch node 134 which follows the applied voltage of line 120. A detector circuit 114 includes a P-channel transistor 164 whose source is coupled to the switch node 134 and whose drain is coupled at a detecting node 135 to the drain of an N-channel transistor 166. The gate of transistor 164 is coupled to sensing node 130, while the source of transistor 166 is coupled to the reference terminal 110.

A regenerator circuit 116 includes N-channel transistors 158 and 160 which serve to reinforce the voltage of the node 135. The drain of transistor 160 is coupled to the detecting node 135, while the source is coupled at a regeneration node 133 to the gate of transistor 158. The drain of transistor 158 is coupled to the sensing node 130, while the source is coupled to the reference terminal 110. The gate of transistor 160 is connected to the voltage sense enable node 94.

N-channel transistor 165 has its gate connected to the node between the second and third input gain stages, and its source and drain connected between regeneration node 133 and ground line 110. Transistor 165 serves as a charge bleeder since in the absence of this transistor, node 133 may stay charged after sense node 94 drops low.

A latch circuit 118 includes a "strong N/weak P" CMOS inverter having an input coupled to the sensing nodes 130 and generating an output at node 138. The inverter is formed by a single N-channel transistor 174 and P-channel transistors 168, 172 connected in series. Further, the latch 118 includes a latching transistor 176 whose drain is coupled to the sensing node 130, wose source is coupled to the reference terminal 110, and whose gate is coupled to the inverter output node 138. N-channel transistor 92 and P-channel transistor 90 have their gates connected to sense enable node 94. The inverter output node 138 is coupled to the gates of switch transistors 150 and 162 as well as to the input of a first buffer (inverter pair) 180. Three additional inverter pairs 182, 184, 186 are also provided for additional gain. The output of the last buffer 186 is a shunting signal on line 140, referenced herein as PUP. The signal PUP on line 140 is provided to the gate of N-channel shunt transistor 190, connecting line 120 to ground terminal 110.

In this embodiment, which is suitable for a conventional N-well or twin-tub semiconductor fabrication process, the P-channel transistors 168 and 172 are fabricated such that the N-well connection for each transistor is independently connectable and is connected to the respective source of each transistor.

Figure 5:
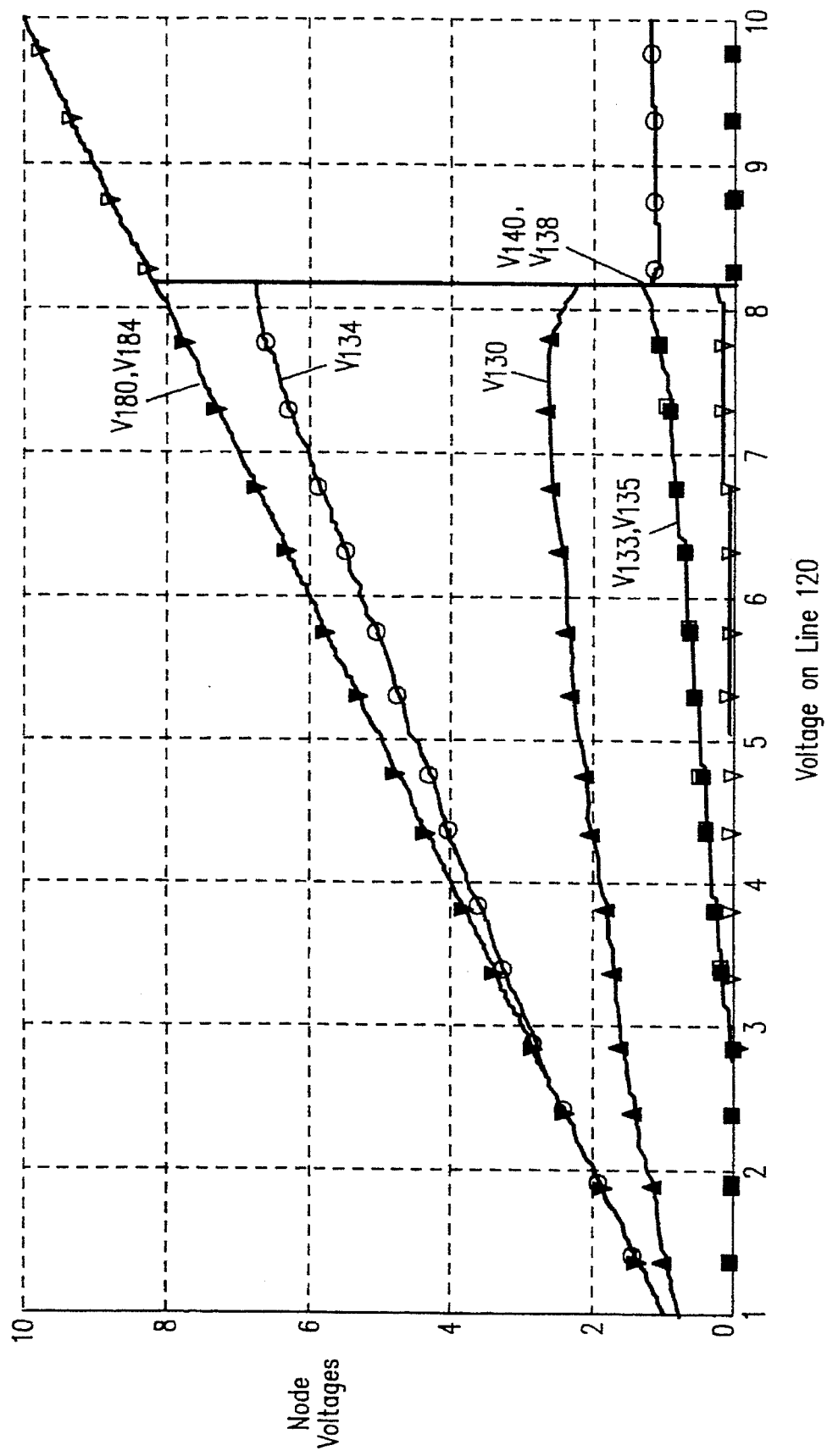
FIG. 5 shows voltage waveforms during a power-up transient of the circuit of FIG. 4.

The operation of the circuit of FIG. 4 can be understood by the waveforms depicted in FIG. 5. These waveforms illustrate the voltage (vertical axis) of each of several nodes of this circuit in response to a transient, ranging from zero volts to ten volts, of the applied voltage on line 120 (horizontal axis). (The voltages in FIG. 5 are at the outputs of the transistor where the node designation is of a transistor.) For this example, the transistor (gate) sizes are summarized in Table 1. (Note in Table 1 that e.g. transistor "180P" refers to the P-channel transistor in buffer 180 and "180N" refers to the N-channel transistor in buffer 180. Similar notation is used for the transistors in buffers 182, 184 and 186.)

Initially, all node voltages are at zero volts. As the applied (transient) voltage on line 120 starts to rise, switch transistors 150 and 162 become conductive as soon as the applied voltage nears the P-channel threshold voltage, at which point the voltage of the switch node 131, and the voltage of the switch node 134, $V_{134}$, are brought to substantially the applied voltage and subsequently follow the applied voltage transient upwards. The voltage generated on the sensing node 130, $V_{130}$, is principally determined by the ratio of the sizes of transistors 152 and 154 and approximates the voltage generated by a resistive divider between the switch node 131 (which follows the applied transient voltage) and the reference terminal 110. The N-channel device 156 is turned on by the voltage sense enable signal 94. It is kept off prior to receiving this signal to guarantee that the voltage on node 131 closely matches the voltage on node 130 prior to enabling voltage sensing.

TABLE 1

| Transistor Reference No. | Width (microns) | Length (microns) | Conductivity |
|---|---|---|---|
| C1 | 200 | 30 | N |
| 86 | 7 | 1 | P |
| 88 | 2.6 | 1 | N |
| 90 | 2.6 | 6 | P |
| 92 | 20 | 1 | N |
| 96 | 21 | 1 | P |

TABLE 1-continued

| Transistor Reference No. | Width (microns) | Length (microns) | Conductivity |
|---|---|---|---|
| 98 | 2.6 | 1 | N |
| 100 | 48 | 1 | P |
| 102 | 16 | 1 | N |
| 150 | 20 | 1.5 | P |
| 152 | 9 | 6 | P |
| 154 | 20 | 1 | P |
| 156 | 20 | 1 | N |
| 158 | 20 | 1 | N |
| 160 | 5 | 2 | N |
| 162 | 20 | 1 | P |
| 164 | 20 | 1 | P |
| 166 | 16 | 4 | N |
| 168 | 12 | 2 | P |
| 172 | 12 | 2 | P |
| 174 | 30 | 1 | N |
| 176 | 10 | 4 | N |
| 180P | 7 | 1 | P |
| 180N | 2.6 | 3 | N |
| 182P | 14 | 1 | P |
| 182N | 5.2 | 1 | N |
| 184P | 42 | 1 | P |
| 184N | 15.6 | 1 | N |
| 186P | 240 | 1 | P |
| 186N | 80 | 1 | N |
| 190 | 4000 | 1 | N |

As the applied voltage rises in a positive-going transient, the voltage of the sensing node 130, $V_{130}$, which tracks the applied voltage potential, also increases, although typically at a lesser rate of rise than the voltage of the switch node 131 and the switch node 134, $V_{134}$. Consequently, the gate-to-source voltage of transistor 164, which is the (negative value) voltage of the sensing node 130 minus the voltage of the switch node 134 ($V_{130}-V_{134}$), increases in absolute value as the voltage of these two nodes initially diverges with increasing applied transient voltage. As the gate-to-source voltage of transistor 164 approaches a P-channel threshold voltage (illustratively for this example at a transient voltage of approximately 1 volt), current starts to flow through transistor 164 and the voltage of the detecting node 135, $V_{135}$, begins to rise. As the voltage on node 135 approaches an N-channel threshold, the voltage of the detecting node 135 is provided to the regeneration node 133 through transistor 160. As the voltage of the regeneration node 133, $V_{133}$, approaches the N-channel threshold voltage, transistor 158 becomes conductive and begins to drive the voltage of the sensing node 130 toward the ground reference potential coupled to the reference terminal 110, and which further increases the turn-on voltage of transistor 164. The increased current flow through transistor 164 causes an even higher voltage on the detecting node 135 which provides additional turn-on voltage at the regeneration node 133 to transistor 158. This, of course, provides a regeneration action which causes the voltage of the sensing node 130 to be brought to the ground reference potential.

Note that the gates of each of transistors 156 (divider circuit), 166 (detector circuit), 90, 160 (regenerator circuit), and 92 (latch circuit) are connected to voltage sense enabling node 94. Thus the circuit is enabled only in response to detection of a dV/dt event by ramp detector R1, C1.

In the embodiment of FIG. 4, all P-channel transistors are fabricated in one or more N-wells which are connect as is common with N-well circuit techniques, to the upper rail line 120 unless shown as connected differently (e.g., transistors 168 and 172). Contact to the N-well of a P-channel transistor provides for a backside terminal for the transistor, and affords a means for biasing the backside of the transistor (i.e., the N-well) to a voltage at least as high as the greater of either the drain or source voltage of the transistor. Because of capacitive coupling effects through the N-well of transistor 164, the voltage of detecting node 135, $V_{135}$ is coupled above ground potential by the positive transition of the applied transient voltage, even before transistor 164 becomes conductive. Transistor 160 is provided to isolate regeneration node 133 from this capacitively-coupled voltage on detecting node 135 prevents transistor 158 from prematurely becoming conductive before the desired value of the transient voltage is reached. The value of resistor R1 in this embodiment is approximately 148K ohms; capacitor C1 is in one embodiment an N-channel transistor with its source and drain both connected to ground terminal 110, and its gate to resistor R1, and having a capacitance of about 14.5 to 18.5 pf.

As a consequence of the regeneration action bringing the voltage of the sensing node 130, $V_{130}$, towards the ground reference potential, the voltage of the inverter output 138, $V_{138}$, is driven towards the applied transient voltage and turns off switch transistors 150 and 162, thus interrupting current flow through the voltage divider and the detector. Because transistor 166 remains on (because its gate is connected to voltage sense enable node 94), the voltage of the detecting node 135 is brought back to the ground reference potential after the switch transistor 162 is shut off. Likewise, the voltage of the regeneration node 133, $V_{133}$ is brought back to ground potential due to transistor 160, which also remains on. The latching transistor 176 is provided to hold the voltage of the sensing node 130 at ground reference potential after the inverter output 138, $V_{138}$ switches high. Without this latching transistor, the sensing node 130 would be left in a high impedance state and could be coupled to unpredictable and undesirable voltages. With inverter output 138 switching to a high voltage, buffers 180, 182, 184, 186 (see $V_{180}$, $V_{184}$) act as gain stages to drive the voltages of the gate of shunt transistor 190 (shown in FIG. 5 as $V_{140}$), with a rising transition.

The inverter of latch 118 is preferably implemented as a "strong N/weak P" inverter to provide for an input threshold lower than the typical one-half of the applied transient voltage. This ensures that the inverter output node 138 does not switch until the regeneration action of regenerator circuit 116 is committed and the voltage of the sensing node 130 has been brought near to the ground reference potential.

The pullup device in the inverter of latch circuit 118 is preferably implemented as several P-channel transistors (e.g., transistors 168 and 172), each having a separate N-well connected to the source of each respective transistor, in order to reduce capacitive coupling from the transient, though an N-well, onto inverter output 138. The voltage of node 136 is coupled by the transient through the N-well of transistor 168, but since the N-well of transistor 172 is coupled to node 136 rather than to the upper rail line 120, the voltage coupling onto node 137 from the N-well of transistor 172 is reduced. Similarly, the voltage coupled onto output node 138 is even more reduced than the voltage coupled onto node 137. Such a series-connected P-channel structure ensures that the voltage of the inverter output 138 stays virtually at the ground reference potential, rather than following the transient due to capacitive coupling which could cause errant switching of the buffer 180 and a premature power-up reset signal on line 140.

After the inverter output 138 switches high and turns off switch transistors 150 and 162, the voltages of the switch node 131, and of the switch node 134, are pulled down to voltages close to a P-channel threshold above the reference voltage. Should a static applied voltage be generated through standard means of bringing power up using a power supply, the ramp detection does not sense this slow-rising transient. In this case, the voltage-sense enable node 94 stays at the reference voltage. The entire circuit only allows a negligible amount of current to flow through it in this case, around 8 nA.

When the applied transient voltage is subsequently reduced to a voltage below the predetermined value necessary to generate the shunting signal PUP on line 140, the latch circuit 118 keeps the voltage of the sensing node 130 at ground potential, and the voltage of the inverter output 138 stays high. Consequently, the shunting signal PUP on line 140 remains at the applied voltage (high) and the circuit exhibits a hysteresis characteristic.

The PUP signal will stay high approximately as long as the RC ramp detector time constant (approximately 1 μs) or until the applied transient is pulled down near the reference voltage, which ever occurs first. The former generally occurs, and when it does node 130 is pulled up by P-channel transistor 90, which forces PUP and node 140 to be pulled down to the reference voltage. Because the voltage sense node 94 is at the reference potential, the circuit is disabled. This is the same situation hence as having no dV/dt.

While the waveforms of FIG. 5 suggest that the circuit of FIG. 4 switches in response to a transient of approximately 8.2 V, the desired transient level can be adjusted by adjusting the relative ratios of transistors 152 and 154. Furthermore, while the waveforms of FIG. 5 depict circuit operation where the N-channel threshold voltage is lower than the P-channel threshold voltage (which is typical of many CMOS processes), the circuit of FIG. 4 functions well even if the N-channel threshold voltage is greater than the P-channel threshold voltage (as might be the case for certain transistor fabrication process corners).

While the above circuit description references an N-well CMOS technology, the teachings of this disclosure can be advantageously applied to other semiconductor process technologies, such as a P-well or a twin-tub CMOS technology.

Figure 6:
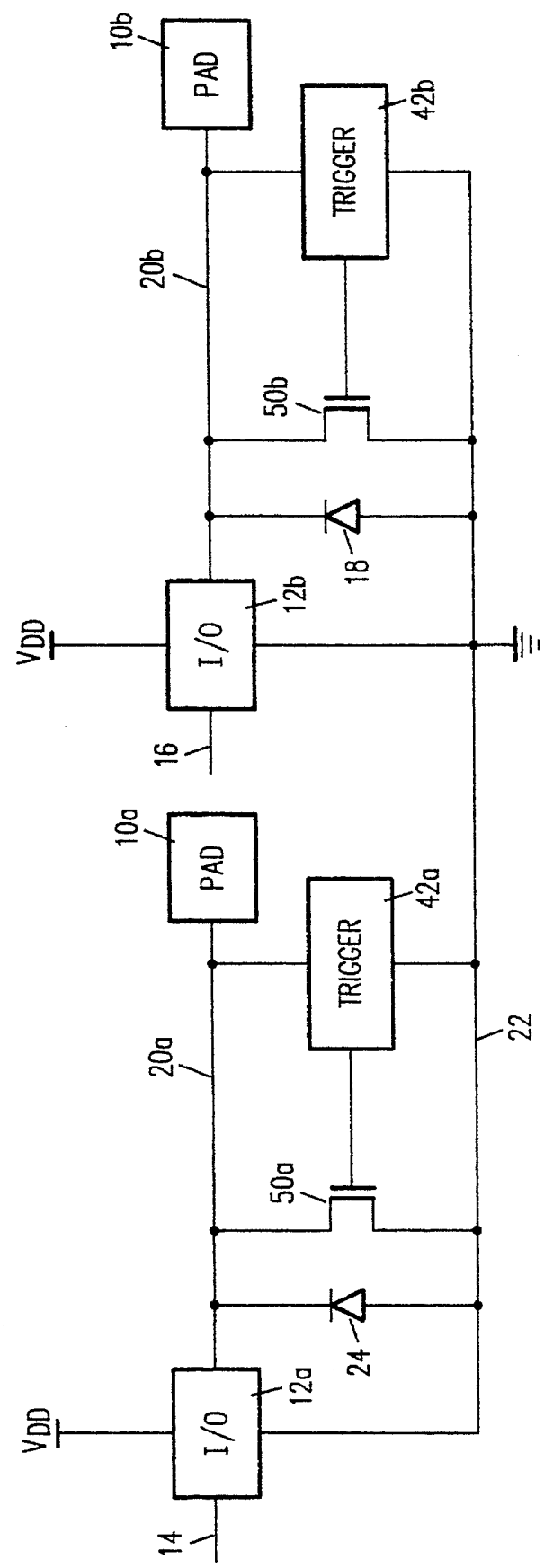
FIG. 6 shows an ESD protection circuit in accordance with the present invention.

The ESD protection circuit of FIG. 6 has many of the same elements of prior art circuit FIG. 1a, except that in FIG. 6, each pad 10a, 10b has an associated shunt transistor 50a, 50b and associated trigger circuit 42a, 42b, with the trigger circuits 42a, 42b connected between the pad lines 20a, 20b and ground line 22. Here the current path of a positive ESD charge at pad 10a is via shunt transistor 50a to ground rail 22 through diode 18 to pad 10b.

The circuit of FIGS. 3 and 4 is usable in the circuit of FIG. 6 where shunt transistor 190 of FIG. 4 corresponds to shunt transistor 50b of FIG. 6, and the remaining circuitry of FIG. 4 corresponds to the trigger circuit block 42b of FIG. 6. Note that the combination of the trigger circuit of FIGS. 3 and 4 with the ESD protection circuit of FIG. 6 is especially advantageous because the floating rail design of FIG. 1a is not needed. The circuit of FIG. 6 will function adequately for an application where the IC is powered down, but the connections to the pad are active. In these situations the circuit of FIG. 6 advantageously will not load down the active connection, unlike the floating rail design application does, which negatively impacts system performance and consumes more power.

In addition, the trigger circuit of FIGS. 3 and 4 is useful in the prior art ESD protection circuit of FIG. 1a as described above.

While the invention has been described with respect to the embodiments set forth above, the invention is not necessarily limited to these embodiments. For example, one skilled in the art could "invert" the trigger circuit by interchanging the role of the N-channel and P-channel transistors. Numerous transistor configurations can be implemented which will provide a circuit having analogous operation. Accordingly, other embodiments, variations, and improvements not described herein are not necessarily excluded from the scope of the invention, which is defined by the following claims.

I claim:

1. A trigger circuit for controlling an electrostatic discharge shunt transistor in an integrated circuit, in response to an electrostatic discharge applied to an input terminal of the integrated circuit, the shunt transistor being connected to the input terminal of the integrated circuit and to a reference voltage of the integrated circuit, the trigger circuit comprising:

a ramp detector circuit connected to the input terminal of the integrated circuit for detecting a rate of change of a voltage of the electrostatic discharge and providing an enable signal in response to the detected rate of change exceeding a predetermined amount;

a comparison circuit connected to the input terminal of the integrated circuit and enabled by the enable signal, and determining when the voltage of the electrostatic discharge reaches a reference voltage level by comparing the voltage of the electrostatic discharge to the reference voltage level; and a buffer circuit connected to receive an output signal from the comparison circuit, and providing a control signal thereby to render the shunt transistor conductive only if the predetermined amount of the rate of change is detected and the voltage of the electrostatic discharge reaches the reference voltage level.

2. The circuit of claim 1, wherein the comparison circuit includes a regenerator for increasing a voltage of the enable signal.

3. A trigger circuit for providing at an output terminal a trigger signal indicating when a voltage of an electrostatic discharge applied to the circuit exceeds a first predetermined value, the output signal having a first state during a first portion of the discharge when the voltage of the discharge is less than the first predetermined value, and having a second state during a remaining portion of the discharge when the voltage of the discharge exceeds the first predetermined value and thereafter, comprising:

a first supply terminal receiving the discharge;

a second supply terminal receiving a ground reference potential;

a voltage divider coupled between the first and second supply terminals and having an output terminal coupled to a sensing node;

a ramp detector coupled to the first supply terminal for detecting a rate of change of the voltage of the discharge and having an output terminal coupled to an enabling terminal of the voltage divider thereby enabling operation of the voltage divider;

a voltage detector coupled between the first and second supply terminals for detecting a voltage of the discharge, and having an input terminal coupled to the sensing node and having an output terminal coupled to a detecting node;

a regenerator having an input terminal coupled to the detecting node, for increasing a voltage at the sensing node, and having an output terminal coupled to the sensing node; and a buffer having an input coupled to the sensing node and having an output coupled to the output terminal.

4. The circuit of claim 3, wherein the voltage divider comprises:

a first transistor having a source coupled to the first supply terminal, a gate coupled to the second supply terminal, and a drain coupled to the sensing node; and a second transistor having a source coupled to the sensing node, a gate coupled to the second power supply terminal, and a drain coupled to the second supply terminal.

5. The circuit of claim 4, wherein the voltage divider further comprises a third transistor having a drain coupled to the drain of the second transistor, a gate coupled to the output terminal of the ramp detector, and a source coupled to the second supply terminal.

6. The circuit of claim 5, wherein the voltage detector comprises:

a fourth transistor having a drain coupled to the detecting node, a gate coupled to the sensing node, and a source coupled to the first supply terminal;

a fifth transistor having a drain coupled to the detecting node, a gate coupled to the output terminal of the ramp detector, and a source coupled to the second supply terminal; and wherein the regenerator comprises a sixth transistor having a drain coupled to the sensing node, a gate coupled to the detecting node, and a source coupled to the second supply terminal.

7. The circuit of claim 6, wherein the regenerator further comprises a seventh transistor coupling the gate of the sixth transistor to the detecting node, the seventh transistor having a drain coupled to the detecting node, a gate coupled to the output terminal of the ramp detector, and a source coupled to the gate of the sixth transistor.

8. The circuit of claim 7, further comprising:

a first inverter having an input terminal coupled to the sensing node, and an output terminal;

a first switch transistor coupling the voltage divider to the first supply terminal, having a gate coupled to the first inverter output terminal; and a second switch transistor coupling the voltage detector to the first supply terminal, having a gate coupled to the first inverter output terminal.

9. The circuit of claim 8, further comprising a latching transistor having a drain coupled to the first inverter input terminal, a gate coupled to the first inverter output terminal, and a source coupled to the second supply terminal.

10. The circuit of claim 9, wherein the first inverter comprises:

an eighth transistor having a drain coupled to the first inverter output terminal, a gate coupled to the first inverter input terminal, and a source coupled to the second supply terminal; and a plurality of series-connected load transistors coupling the first inverter output terminal to the first supply terminal, each having a backside terminal which is connectable independently of the other load transistors and which is connected to each load transistor's respective source terminal.

11. The circuit of claim 10, wherein the gate of a series-connected load transistor coupled to and nearest the first inverter output is connected to the first inverter input terminal; and wherein the gates of the remaining series-connected load transistors are coupled to the second supply terminal.

12. The circuit of claim 10, wherein the first, second, and fourth transistors comprise P-channel MOS transistors; and wherein the third, fifth, sixth, and seventh transistors comprise N-channel MOS transistors.

13. The circuit of claim 12, wherein the first and second switch transistors and the plurality of series-connected load transistors comprise P-channel MOS transistors; and wherein the eighth transistor and the latching transistor comprise N-channel MOS transistors.

14. A method of controlling an ESD shunt transistor in an integrated circuit, the shunt transistor being connected between a voltage supply and a reference voltage of the integrated circuit and acting in response to a voltage transition applied to the integrated circuit, comprising the steps of:

detecting a rate of change of the voltage transition;

determining when the voltage transition reaches a predetermined voltage level; and providing a control signal to render the shunt transistor conductive only if a particular rate of change of the voltage transition is detected and the voltage transition reaches the predetermined voltage level.

15. A method for providing an output signal indicating when a voltage of an electrostatic discharge coupled to a circuit exceeds a predetermined value, comprising the steps of:

sensing by a voltage ramp detector a rate of change of the voltage of the electrostatic discharge;

generating a voltage on a sensing node which is a portion of the voltage of the electrostatic discharge during a first portion of the electrostatic discharge;

detecting when the sensing node voltage and the voltage of the electrostatic discharge differ by more than a predetermined amount, wherein the portion of the voltage generated on the sensing node and the predetermined value are chosen so that the sensing node voltage and the voltage of the electrostatic discharge differ by more than a particular value when the voltage of the electrostatic discharge exceeds the predetermined value;

latching a voltage at the sensing node subsequent to the detecting step;

interrupting current flow through the circuit subsequent to the latching step, thereby eliminating power dissipation therein; and driving the output signal from a first state to a second state subsequent to the latching step only when a particular rate of charge of the voltage of the electrostatic discharge is sensed; and turning on an electrostatic discharge shunt transistor when the output signal is in the second state.

16. The method of claim 15, wherein the step of detecting includes increasing the sensing node voltage.

17. An ESD protection circuit for an integrated circuit having an input/output terminal connected to input/output circuitry, the protection circuit comprising:

a trigger circuit;

a diode; and a shunt transistor, wherein the trigger circuit, the diode and the shunt transistor are each connected in parallel to a ground terminal and are directly connected to a node connecting the input/output terminal to the input/output circuitry;

the trigger circuit including:

a ramp detector circuit connected to the input/output terminal of the integrated circuit for detecting a rate of change of a voltage of an electrostatic discharge and providing an enable signal in response to the detected rate of change exceeding a predetermined amount;

a comparison circuit connected to the input/output terminal of the integrated circuit and enabled by the enable signal, and determining when the voltage of the electrostatic discharge reaches a reference voltage level by comparing the voltage of the electrostatic discharge to the reference voltage level and a buffer circuit connected to receive an output signal from the comparison circuit, and providing a control signal thereby to render the shunt transistor conductive only if the predetermined amount of the rate of change is detected and the voltage of the electrostatic discharge reaches the reference voltage level.

\* \* \* \* \*

UNITED STATES PATENT AND TRADEMARK OFFICE
CERTIFICATE OF CORRECTION

PATENT NO. : 5,508,649
DATED : May 16, 1996
INVENTOR(S) : Shay

It is certified that error appears in the above-indentified patent and that said Letters Patent is hereby corrected as shown below:

At column 5, line 11, delete "wose" and substitute -- whose--.

Signed and Sealed this

Fifteenth Day of October, 1996

*Attest:*

BRUCE LEHMAN

*Attesting Officer*     *Commissioner of Patents and Trademarks*